United States Patent [19]

Koyama et al.

[11] Patent Number: 5,789,762
[45] Date of Patent: Aug. 4, 1998

[54] SEMICONDUCTOR ACTIVE MATRIX CIRCUIT

[75] Inventors: Jun Koyama; Yasuhiko Takemura; Masahiko Hayakawa, all of Kanagawa; Shunpei Yamazaki, Tokyo; Akiharu Miyanaga; Hisashi Ohtani, both of Kanagawa, all of Japan

[73] Assignee: Semiconductor Energy Laboratory Co., Ltd., Japan

[21] Appl. No.: 526,935

[22] Filed: Sep. 12, 1995

[30] Foreign Application Priority Data

| Sep. 14, 1994 | [JP] | Japan | 6-247123 |
| Oct. 28, 1994 | [JP] | Japan | 6-288853 |
| May 19, 1995 | [JP] | Japan | 7-145348 |

[51] Int. Cl.$^6$ ............... H01L 31/036; H01L 29/04
[52] U.S. Cl. ............... 257/66; 257/65; 257/69; 257/72; 257/391
[58] Field of Search ............... 257/65, 66, 72, 257/391, 69

[56] References Cited

U.S. PATENT DOCUMENTS

| 5,147,826 | 9/1992 | Liu et al. | |
| 5,275,851 | 1/1994 | Fonash et al. | |
| 5,481,121 | 1/1996 | Zhang et al. | 257/72 |
| 5,492,843 | 2/1996 | Adachi et al. | 437/21 |
| 5,529,937 | 6/1996 | Zhang et al. | 437/10 |
| 5,576,556 | 11/1996 | Takemura et al. | 257/66 |
| 5,581,092 | 12/1996 | Takemura | 257/65 |

OTHER PUBLICATIONS

G. Liu et al., "Polycrystalline silicon thin film transistors on Corning 7059 glass substrates using short time. low–temperature processing," *Appl. Phys. Lett.* 62(20), May 17, 1993, pp. 2554–2556.

G. Liu et al., "Selective area crystallization of amorphous silicon films by low–temperature rapid thermal annealing," *Appl. Phys. Lett.* 55(7), Aug. 14, 1989, pp. 660–662.

*Primary Examiner*—Valencia Wallace
*Attorney, Agent, or Firm*—Sixbey, Friedman, Leedom & Ferguson; Gerald J. Ferguson, Jr.; Jeffrey L. Costellia

[57] ABSTRACT

It is intended to provide a semiconductor circuit including thin-film transistors (TFTs) having a small leak current and TFTs capable of operating at high speed, and a method for manufacturing such a circuit. A material containing a catalyst element is selectively formed so as to be in close contact with an amorphous silicon film, or a catalyst element is selectively introduced into an amorphous silicon film. The amorphous silicon film thus processed is crystallized by illumination with laser light or strong light equivalent to it. A crystalline silicon area with a small amount of catalyst element is used for TFTs in a pixel circuit and a crystalline silicon area with a large amount of catalyst element is used for TFTs in peripheral circuits of an active matrix circuit.

33 Claims, 6 Drawing Sheets

SEMICONDUCTOR ACTIVE MATRIX CIRCUIT

BACKGROUND OF THE INVENTION

1. Field of the Invention

The present invention relates to a semiconductor circuit having a plurality of thin-film transistors (TFTs) and a manufacturing method therefor. The invention can be practiced with either an insulative substrate such as a glass substrate or a semiconductor substrate such as a single crystal silicon substrate.

The invention is effectively used in a semiconductor circuit having a matrix circuit, such as a monolithic active matrix circuit (used in a liquid crystal display, for instance), in which the off-current and its variation are required to be small, and peripheral circuits for driving the matrix circuit. The peripheral circuits are required to operate at high speed and have a small variation of the on-current.

2. Description of the Related Art

In recent years, studies have been made of insulated-gate semiconductor devices having a thin-film active layer (also called an active region) on an insulative substrate. In particular, thin-film insulated-gate transistors, i.e., thin-film transistors (hereinafter referred to as TFTs) have been studied extensively.

The TFTs, which are formed on a transparent insulative substrate, are intended to be used, in a display device having a matrix structure such as a liquid crystal display, to control respective pixels and to be used in drive circuits.

The TFTs are classified into amorphous silicon TFTs and crystalline silicon TFTs by the material and crystal state of a thin-film semiconductor used.

In general, amorphous semiconductors cannot be used for the TFT that is required to operate at high speed because of their small electric field mobilities. For this reason, crystalline silicon TFTs have been studied and developed to fabricate circuits of higher performance. To produce a crystalline silicon film, there are known a method in which amorphous silicon is thermally annealed for a long time at about 600° C. or a higher temperature, and a method in which strong light such as laser light is applied to amorphous silicon (optical annealing).

Crystalline semiconductors can provide high-speed operation because they have larger electric field mobilities than amorphous semiconductors. Further, with crystalline semiconductors, a CMOS circuit can be formed because not only NMOS TFTs but also PMOS TFTs can be obtained in a similar manner. For example, a CMOS circuit that constitutes a peripheral circuit (for instance, a driver) of an active matrix liquid crystal display device can be formed by TFTs.

SUMMARY OF THE INVENTION

FIG. 1(A) is a block diagram showing a typical monolithic active matrix circuit used in a liquid crystal display. A column decoder/driver 1 and a row decoder/driver 2 are formed as peripheral circuits on a glass substrate 7. A pixel circuit 4 composed of switching transistors and capacitors is formed in a matrix area 3. The matrix area 3 and the peripheral circuits are connected to each other by wiring lines 5 of the same number as the number of rows and wiring lines 6 of the same number as the number of columns.

With the above configuration, TFTs used in the peripheral circuits are required to operate at high speed. To this end, in the TFTs, a current during a selected period (on-current) should be large and its variation should be small.

On the other hand, TFTs used in the pixel circuits are required to have characteristics that allow long-term storage of charge in the capacitors; that is, the off-current (also called the leak current) during a non-selected period (the gate electrode is reversely biased) should be sufficiently small and have a small variation. In specific terms, the off-current should be smaller than 1 pA and its variation should be less than 10%. In contrast to the case of being used in the peripheral circuits, the on-current is not required to be so large.

Although the above characteristics are physically contradictory, it is necessary to form TFTs having the respective kinds of characteristics on the same substrate at the same time.

However, in general, all the TFTs manufactured by the same process exhibit similar characteristics. For example, both of TFTs in a matrix area and TFTs in peripheral circuit areas using crystalline silicon that has been crystallized by thermal annealing exhibit similar characteristics; that is, they all have a small off-current or a large on-current.

This is also true in the case of using silicon that has been crystallized by illumination with strong light such as laser light. It is difficult to realize, on the same substrate, the small off-current for the matrix circuit and the large off-current for the peripheral circuits.

An object of the present invention is to solve the above problem, that is, to provide a technique of manufacturing both of TFTs having a small off-current usable in a matrix circuit and TFTs having a large on-current usable in peripheral circuits on the same substrate by the same process. Another object of the invention is to provide a structure in which both of TFTs having a small off-current usable in a matrix circuit and TFTs having a large on-current usable in peripheral circuits are integrated on the same substrate.

The studies of the present inventors have revealed that by adding a very small amount of a catalyst element to a substantially amorphous silicon coating, the crystallization can be accelerated, the crystallization temperature can be lowered, and the crystallization time can be shortened. The catalyst element may be one or a plurality of elements selected from Fe, Co, Ni, Rh, Pd, Os, Ir, Pt, Cu and Au.

Specifically, first, such a catalyst element is introduced into an amorphous silicon film by bringing a coating, particles, clusters, or the like including the catalyst element close contact with the amorphous silicon film or by some other method such as ion implantation. The obtained structure is heated at 450°–580° C. for about 4–8 hours. Thus, a crystalline silicon film can be obtained.

It is further interesting that the crystallization proceeds as the catalyst element diffuses. Therefore, a portion adjacent to the catalyst-added portion is also crystallized as the catalyst diffuses; that is, the crystallization proceeds in the horizontal direction. By virtue of directional properties of the crystal, crystalline silicon thus obtained exhibits much superior electrical characteristics. This type of crystallization method is called horizontal growth. On the other hand, the crystallization method in which no specific horizontal crystal growth is intended is called vertical growth.

Crystallization can be effected similarly as in the above thermal annealing by illumination with laser light or strong light equivalent to it. The energy density of laser light or equivalent strong light depends on the wavelength and pulse width of a light source, the temperature of an amorphous silicon film (or crystalline silicon film), and other factors.

The studies of the inventors have shown that a crystalline semiconductor having sufficient characteristics to form semiconductor devices can be obtained by setting the concentration of a catalyst element at $1\times10^{15}$ to $1\times10^{19}$ atoms/cm$^3$, preferably $1\times10^{16}$ to $2\times10^{18}$ atoms/cm$^3$. Such a low concentration may be measured by secondary ion mass spectroscopy (SIMS). It may be the case that such a measurement produces different concentration values for a portion close to the boundary and for the inside of the same silicon film. The above-mentioned values are minimum measurement values irrespective of whether they were obtained for the boundary or the inside.

The observations by a TEM (transmission electron microscope) revealed that a crystalline silicon film that has been crystallized by thermal annealing has non-crystallized portions. In contrast, it has also been discovered that a silicon film that has been crystallized by illumination with strong light such as laser light and a silicon film that has been first crystallized to a level higher than a certain level by thermal annealing and then illuminated with laser light have almost no non-crystallized portion and exhibit much superior crystallinity.

The degree of crystallinity can be improved in the above manner. Further, amorphous components remaining at crystal boundaries can be crystallized by weakening barriers of the boundaries which cannot be removed only by thermal annealing. In this method, even if the degree of crystallization by thermal annealing is low, the crystallization can be made complete by the subsequent laser light illumination.

Where a coating of a catalyst element is formed, its thickness is made very small because the concentration of the catalyst element should be sufficiently low. A catalyst coating may be formed by using a vacuum device for sputtering, evaporation, or the like. Alternatively, it may be formed under the atmospheric pressure by spin coating or a dipping method. The latter methods are simple and high in productivity. In the latter methods, an acetate, a nitrate, or a salt of an organic acid containing a catalyst element may be dissolved in a proper solvent to obtain a suitable density.

In particular, spin coating using a solvent is a useful means for attaining uniform crystal growth because it allows a catalyst element to exist uniformly in a thin coating. Further, according to this method, the catalyst element density in a solution can be controlled easily, which means that the catalyst element concentration in a resulting silicon film can be controlled easily.

In this regard, the common film forming method such as sputtering and evaporation are disadvantageous because of a difficulty in forming a uniform film at a very small thickness of less than 100 Å. The common film forming methods such as sputtering and evaporation are also disadvantageous in terms of a difficulty in controlling the catalyst element concentration in a finally produced silicon film.

Naturally, the crystallization time becomes shorter as the annealing temperature becomes higher. Further, as the concentration of a catalyst element becomes higher, the crystallization temperature becomes lower and the crystallization time becomes shorter.

However, since basically the existence of any of the catalyst elements mentioned above in silicon is not preferable, its concentration should be made as low as possible. (The methods of introducing a catalyst element by using a solution is advantageous in this respect.)

The concentration of a catalyst element that is necessary for crystallization can be lowered by applying laser light or equivalent strong light to a film containing the catalyst element.

TFTs produced by using a silicon film that has been crystallized by use of a catalyst element can have a large on-current with a small variation, and are therefore most suitable for peripheral circuits of an active matrix circuit. However, TFTs produced by such a method have a large off-current variation, which is fatal to employment in a matrix circuit. The off-current variation is probably due to the catalyst element, but this assumption has not been confirmed yet.

This does not mean that the employment of a catalyst element is not practical, because a catalyst element can be added selectively. According to the invention, with attention paid to this point, silicon that has been crystallized by using a catalyst element is used for TFTs in peripheral logic circuit areas while silicon that has been crystallized without using a catalyst element is used for TFTs in a matrix circuit of a monolithic active matrix circuit.

That is, according to a first aspect of the invention, there is provided a monolithic active matrix circuit comprising:

thin-film transistors in a peripheral circuit in each of which transistors an active region contains a catalyst element that has been introduced intentionally; and thin-film transistors in a matrix area in each of which transistors the concentration of a catalyst element in an active region is lower than in the active region of each of the thin-film transistors in the peripheral circuit.

With this constitution, areas having different degrees of crystallinity can easily be formed on the same substrate. The TFTs in the peripheral circuits can have a large mobility while the TFTs in the pixel matrix area can have a small mobility but a low off-current.

In each of the TFTs in the pixel matrix area, to reinforce the low off-current characteristic, low impurity concentration regions (lightly doped regions) are formed between the channel forming region and the source and drain regions. The drain-side region of the low impurity concentration region is generally called a lightly doped drain (LDD) region.

To selectively differentiate the concentrations of a catalyst element in the above manner, the amount of introducing the catalyst element is controlled selectively. In the case of ion doping, the dose is controlled selectively. In the case of forming a layer containing a catalyst element so as to be substantially in close contact with the silicon film, the thickness and the density of the catalyst element in a compound constituting the layer are selectively controlled. To provide a region selectively where no catalyst element is introduced, a mask may be used.

In the above cases, it is convenient to define the amount of a catalyst element introduced into the silicon film in terms of an amount per unit area (i.e., dose) rather than the concentration.

According to a second aspect of the invention that is directed to this point, there is provided a monolithic active matrix circuit comprising:

thin-film transistors in a peripheral circuit; and thin-film transistors in a matrix area in each of which transistors the amount per unit area of a catalyst element contained in an active region is ⅒ or less of the amount per unit area of a catalyst element contained in an active area of each of the thin-film transistors in the peripheral circuit.

The above circuit can be formed by a process comprising the steps of:

(1) forming an amorphous silicon film, a first area where a coating containing a catalyst element is so formed as to be substantially in contact with the amorphous silicon film, and a second area where no coating containing a catalyst element is so formed as to be substantially in contact with the amorphous silicon film;

(2) crystallizing the amorphous silicon film in the first area or in both of the first and second areas by a heat treatment;

(3) crystallizing, accelerating crystallization of, or improving crystallinity of silicon films in the first and second areas by illuminating those with laser light or strong light equivalent to it; and (4) forming island-like active regions by etching the silicon films.

Alternatively, the above circuit can be formed by a process comprising the steps of:

(1') forming a first area where a catalyst element is introduced into a silicon film intentionally, and a second area where a catalyst element is not introduced into a silicon film intentionally;

(2') crystallizing the silicon film in the first area or in both of the first and second areas by a heat treatment;

(3') crystallizing, accelerating crystallization of, or improving crystallinity of the silicon films in the first and second areas by illuminating those with laser light or strong light equivalent to it; and (4') forming island-like active regions by etching the silicon films.

Step (1) requires that the coating containing the catalyst element be "substantially" in close contact with the silicon film. The term "substantially" is intended to include direct contact and indirect contact through a thin coating, because a catalyst element can be introduced even through, for instance, a silicon dioxide film of about several tens of angstroms.

To form an area where a catalyst element is introduced in step (1'), ion implantation, for instance, may be performed. Alternatively, a catalyst element may be introduced by forming a coating of a catalyst element compound and then performing thermal annealing.

In step (1'), crystallization is not always attained even if the area where a catalyst element has been introduced is heated. For example, when a heat treatment is performed at about 300° C., although amorphous silicon is not crystallized, catalyst element can be diffused into amorphous silicon.

The following four preferred embodiments of the invention are conceivable.

According to a first embodiment, after a catalyst element is mainly added to the peripheral circuit in a selective manner by forming a proper arrangement, crystallization is effected in both of the peripheral circuit and the matrix circuit by optical annealing in which laser light is applied to the entire substrate.

In this embodiment, regions of different degrees of crystallinity can be obtained selectively based on the phenomenon that the annealing effect of the laser light illumination depends on the existence of a catalyst element or its concentration.

According to a second embodiment, after a catalyst element is mainly added to the peripheral circuit in a selective manner by forming a proper arrangement, thermal annealing is performed to effect crystallization or improve crystallinity in the peripheral circuit. Then, crystallization is effected in both of the peripheral circuit and the matrix circuit by optical annealing in which laser light is applied to the entire substrate.

In this embodiment, crystallization is effected over the entire substrate if the thermal annealing is performed at a high temperature of 600° C. or higher. When heating is performed, for instance, at 550° C. for 4 hours, a region where a catalyst element has been introduced or a catalyst element concentration is high is crystallized.

In the subsequent optical annealing, not only the crystallinity of the already crystallized region can be improved but also the region that has not been crystallized can now be crystallized.

According to a third embodiment, after a catalyst element is mainly added to the peripheral circuit in a selective manner by forming a proper arrangement, optical annealing is performed over the entire substrate, to effect crystallization or improve crystallinity in both of the peripheral circuit and the matrix circuit. Then, thermal annealing is performed.

According to a fourth embodiment, after a catalyst element is mainly added to the peripheral circuit in a selective manner by forming a proper arrangement, thermal annealing is performed to effect crystallization or improve crystallinity mainly in the peripheral circuit. Then, optical annealing is performed over the entire substrate, to effect crystallization or improve crystallinity in both of the peripheral circuit and the matrix circuit. Further, thermal annealing is performed thereafter.

The second and the fourth method include the step of effecting crystallization by thermal annealing using a catalyst element. This crystallization may be either horizontal growth or vertical growth.

In order to obtain higher crystallinity, it is very effective to conduct a thermal treatment for crystallization at a temperature of 800° C. to 1100° C. using a quartz glass substrate. Since a function of a metal element for promoting crystallization can be made maximum use of in this case, an excellent crystallinity can be obtained in the crystalline silicon film.

As described above, in the invention, the area where a catalyst element has a lower concentration is used for the active matrix circuit. That is, the area where a catalyst element has a lower concentration or has not been introduced can constitute a region where the degree of crystallinity is low (i.e., the degree of orderliness is relatively low). By using this region, TFTs can be formed which have a small mobility but a low off-current with a small variation.

The area where a catalyst element has a higher concentration is used for the peripheral circuits. That is, by introducing a catalyst element at a relatively high concentration and utilizing its effect, a region where the degree of crystallinity is high (i.e., the degree of orderliness is relatively high) can be constituted. By using this region, TFTs can be formed which have a large mobility and a large on-current.

In the above manner, TFTs having a low-off current and TFTs capable of operating at high speed, i.e., two kinds of TFTs having contradictory characteristics can be selectively formed on the same substrate by one single consecutive steps.

By forming a LDD (lightly doped drain) region of each TFT in the pixel matrix area, the low off-current characteristic of those TFTs is reinforced.

Although the invention is most effective when applied to a monolithic active matrix circuit, it is apparent that the invention is also effective even when applied to other circuits. That is, the application field of the invention is not limited to the monolithic active matrix circuit.

It goes without saying that in a system shown in FIG. 1(B) in which a display device and a computer is unified, the invention can be applied to a decoder/driver and an active matrix circuit that are used in the display device.

Considering the transistors that constitute a memory and a CPU. The memory is a random access memory (RAM) such as a DRAM or a SRAM, and it is required that the off-current and its variation be small. On the other hand, high-speed operation is required in the CPU.

There contradictory requirements can be satisfied by using, for the former purpose, a crystalline silicon film that has been formed without introducing a catalyst element, and using, for the latter purpose, a crystalline silicon film that has been formed by introducing a catalyst element.

In addition to the selective introduction of the catalytic element, the thin film transistor for a low off current characteristics preferably has a low concentration impurity region, and the thin film transistor for h high speed operation preferably does not have a low concentration impurity region.

A correction memory stores features of individual pixels as data. It is preferred that the correction memory to be a nonvolatile memory. In the correction memory, the off-current is not necessarily required to be small, nor the operation speed is be so fast either. Therefore, a crystalline silicon film to which no catalyst element has been added is suitable for a configuration capable of storing data stably.

In the invention, the concentration of a catalyst element in a region for constituting TFTs that are required to have a small off-current is set lower than in a region for constituting high-speed TFTs. It is preferred that the amount per unit area of the catalyst element in the latter region to be 10 times or more of that in the former region.

A catalyst element forms trap states in a silicon film, and is a factor of deteriorating the off-current characteristic. Therefore, it is preferred that if possible no catalyst element exists in a silicon film for constituting TFTs in the pixel area which TFTs are required to have a small off-current.

A catalyst element deteriorates the off-current characteristic for the following reason. That is, carriers operating through trap states that are caused by a catalyst element contribute to, i.e., increase the off-current.

More specifically, to decrease the off-current, it is desirable that the concentration of a catalyst element in the active region of TFTs that are required to have a small off-current be lower than $1 \times 10^{15}$ atoms/cm$^3$.

In the third and fourth ones of the above-described four preferred embodiments of the invention, thermal annealing is performed after optical annealing. This is effective in removing stress caused by the optical annealing. Where the optical annealing is performed by laser light illumination, defects are left in a film. Thermal annealing is effective in reducing such detects.

In the second and fourth embodiments, thermal annealing is performed after the addition of a catalyst element. In this step, while crystallization proceeds in a region to which a catalyst element has been added, the thermal annealing sufficiently removes hydrogen from the amorphous silicon film in a region to which no catalyst element has been added. Therefore, subsequent optical annealing becomes more effective. The thermal annealing for this purpose may be performed at 450°–580° C. for 0.5–8 hours.

DETAILED DESCRIPTION OF THE PREFERRED EMBODIMENTS

Figure 1A:
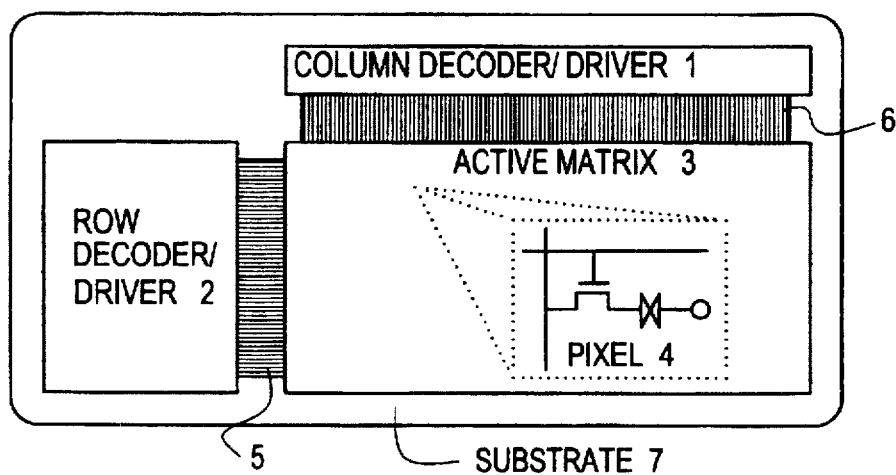
FIG. 1(A) shows an example of a configuration of a monolithic active matrix circuit.
Figure 1B:
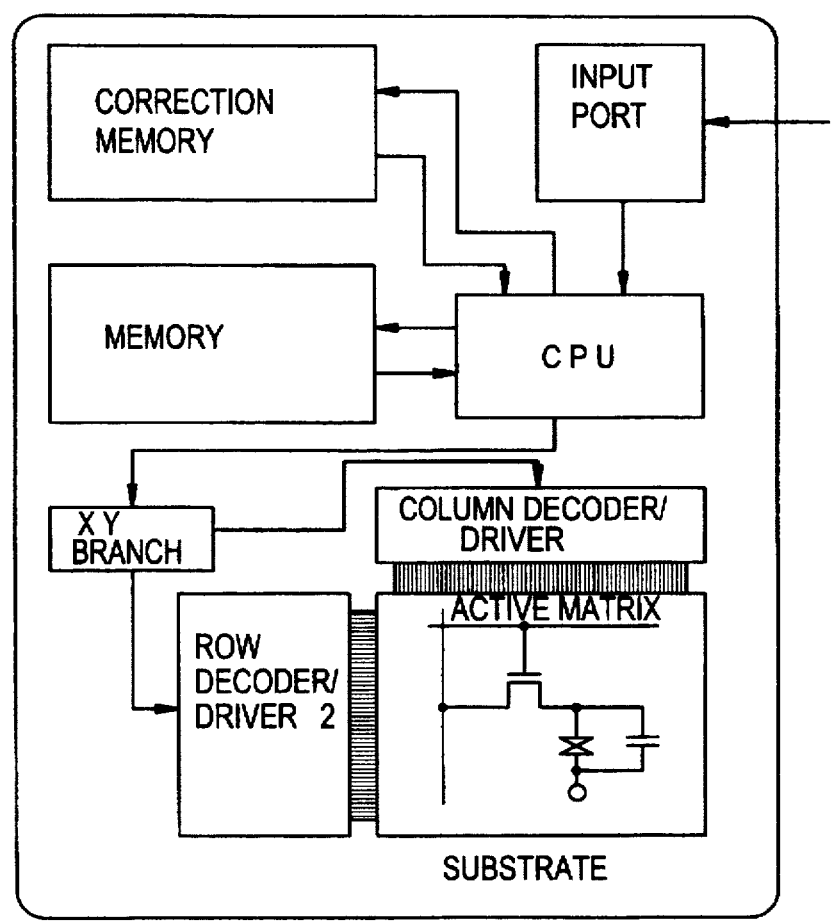
FIG. 1(B) shows a configuration of a liquid crystal display using the monolithic active matrix circuit of FIG. 1(A)
Figure 2A:
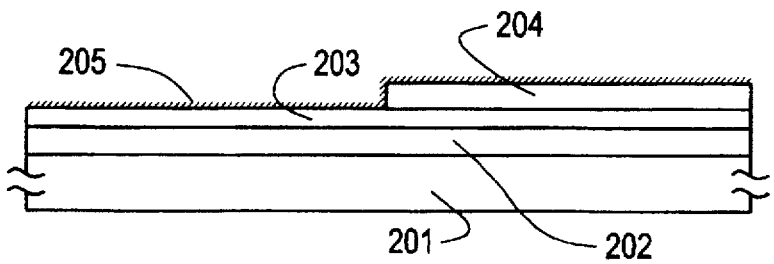
FIGS. 2(A)–2(F) are sectional views showing a manufacturing process according to embodiments 1 and 2 of the present invention.
Figure 2B:
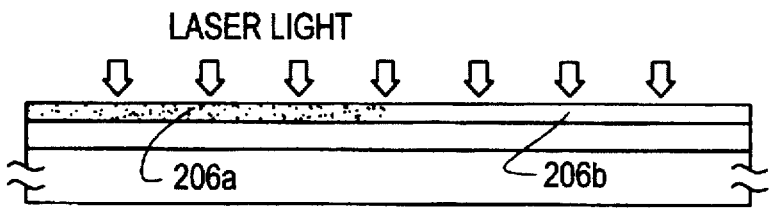
Figure 2C:
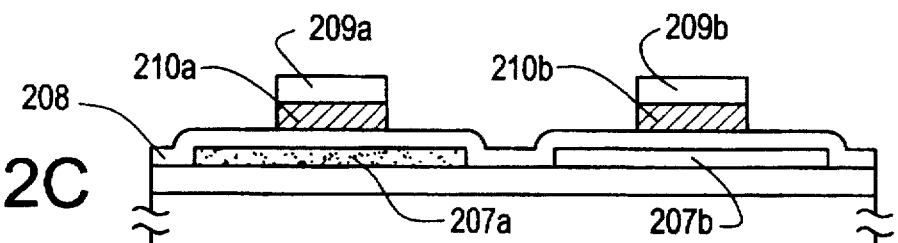
Figure 2D:
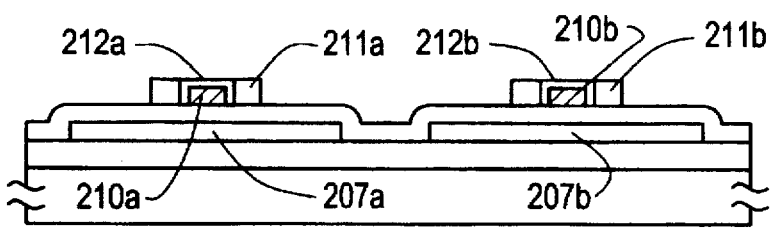
Figure 2E:
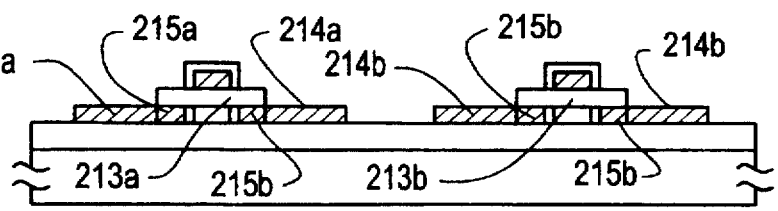
Figure 2F:
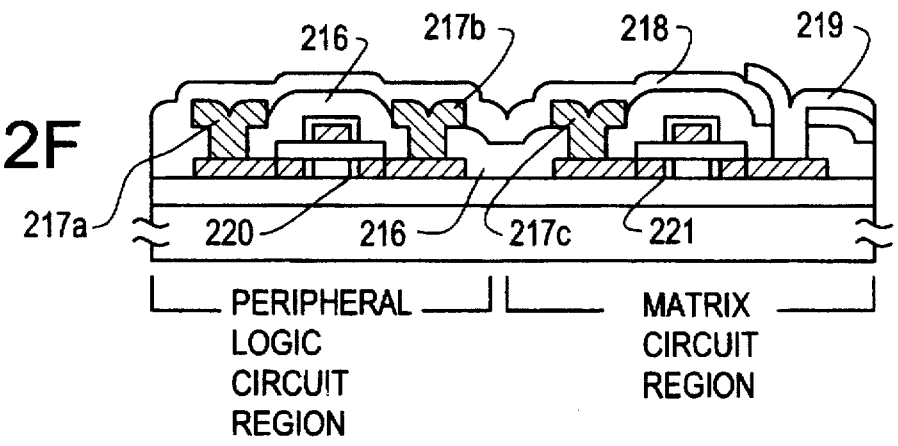
Figure 3A:
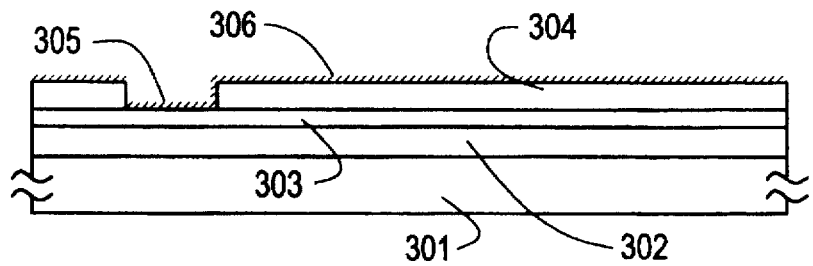
FIGS. 3(A)–3(F) are sectional views showing a manufacturing process according to embodiments 3 and 4 of the invention.
Figure 3B:
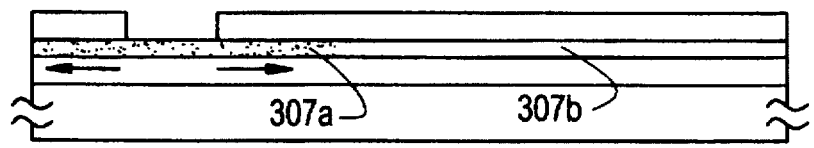
Figure 3C:
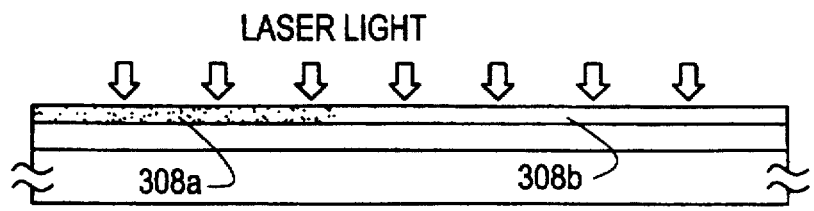
Figure 3D:
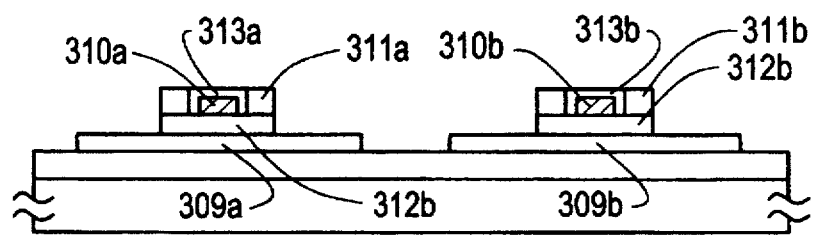
Figure 3E:
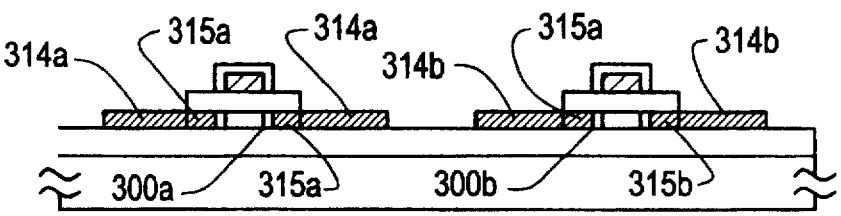
Figure 3F:
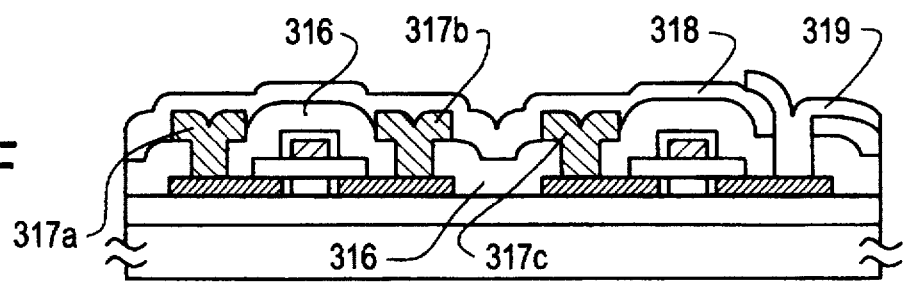

Embodiments of the present invention will be described in detail by way of embodiments illustrated in FIGS. 2(A)–2(F) and FIGS. 3(A)–3(F).

Embodiment 1

FIGS. 2(A)–2(F) show a manufacturing process of this embodiment, which is directed to one of the two substrates of an active matrix liquid crystal display device. This embodiment relates to a method of manufacturing a monolithic active matrix circuit including CMOS peripheral circuits. For simplification, a peripheral circuit portion is also illustrated only as an NMOS transistor in the figures. In FIGS. 2(A)–2(F), the left-hand side and the right-hand side representatively show a peripheral circuit portion and a matrix circuit portion, respectively.

First, a 2,000-Å-thick undercoat silicon dioxide film 202 is formed on a glass substrate 201 by plasma CVD. Monosilane (SiH$_4$) and dinitrogen monoxide (N$_2$O) are used as material gases of the plasma CVD, and the substrate temperature during film deposition is set at 380°–500° C., for instance, 430° C. The silicon dioxide film 202 formed in this manner can be a rigid film that exhibits a relatively low etching rate. This is due to the fact that the film 202 is actually a silicon oxynitride film containing nitrogen at 1–10% because of inclusion of dinitrogen monoxide in the material gases. The typical etching rate of the silicon dioxide film 202 is 800–1,100 Å/min when etching is performed at 23° C. by using acetic acid buffered hydrofluoric acid (ABHF) in which a ratio among hydrofluoric acid, ammonium fluoride and acetic acid is 1:50:50.

Subsequently, a 500-Å-thick amorphous silicon film 203 is deposited by plasma CVD or low-pressure thermal CVD. A 1,000-Å-thick silicon dioxide film 204 is then deposited by plasma CVD by using TEOS and oxygen as material gases. The silicon dioxide film 204 thus formed has a typical etching rate of 2,000–3,000 Å/min (with ABHF at 23° C.), which is larger than the previously formed silicon dioxide film 202. The silicon dioxide film 204 serves as a mask when silicon is crystallized.

Next, the silicon dioxide film 204 is patterned by a known photolithographic method, so that an amorphous silicon film only in the peripheral circuit area is exposed. Then, a very thin (estimated to be 40–100 Å) silicon dioxide film is formed on the exposed surface of the amorphous silicon film by performing thermal annealing at 550° C. for 1 hour in an oxidizing atmosphere.

Then, a very thin nickel acetate film 205 is formed by spin coating. This is done by placing nickel, which is a catalyst element for accelerating crystallization of silicon, in contact with the amorphous silicon film 203 by using a nickel acetate solution of 1–100 ppm. The reason why the thin silicon dioxide film is formed beforehand on the amorphous silicon film is to allow the solution to uniformly cover the amorphous silicon surface. (see FIG. 2(A))

Subsequently, thermal annealing is performed at 550° C. for 4 hours in a nitrogen atmosphere. Nickel acetate is decomposed at about 400° C. to produce nickel. In the peripheral circuit area where the nickel acetate thin-film is substantially in contact with the amorphous silicon film, the thermal annealing step causes nickel to enter amorphous silicon. As a result, amorphous silicon is crystallized (vertical growth) in the peripheral circuit area; that is, a crystalline silicon region 206a is formed.

On the other hand, in the matrix area, the silicon dioxide film 204 prevents nickel from reaching silicon. Almost no amorphous silicon is crystallized at 550° C. in the area where no catalyst element exists; that is, amorphous silicon is left as it is.

However, the thermal annealing causes hydrogen to be sufficiently removed from amorphous silicon to modify it into a state of being crystallized very easily. An amorphous silicon film deposited by CVD (particularly plasma CVD) contains hydrogen at a high percentage; 10% or more in a deposited state. By performing thermal annealing in this state, an amorphous silicon region (denoted by 206b) with a hydrogen content of 0.1% or less (made of almost only silicon) can be obtained. The amorphous silicon in the hydrogen-removed state, i.e., in a state of being crystallized very easily can be crystallized, for instance, by illumination with laser light with high reproducibility.

After the silicon dioxide film 204 that served as a mask for nickel is removed to expose the silicon film, illumination with XeCl excimer laser light (wavelength: 308 nm) is performed. In this embodiment, the energy density of the laser light is set at 250–300 mJ/cm$^2$. As a result, the crystallinity of the crystalline silicon region 206a is improved and the amorphous silicon region 206b is crystallized.

In this embodiment, since the hydrogen concentration in the amorphous silicon region 206b is sufficiently reduced by the thermal annealing that is performed before the laser light illumination, sufficiently high crystallinity can be obtained even with the low energy density.

To reduce stress due to the laser light illumination, thermal annealing is performed again. In this embodiment, the thermal annealing is performed at 550° C. for 4 hours. (see FIG. 2(B))

Thereafter, island-like active regions 207a and 207b are formed by etching the crystalline silicon regions 206a and 206b. A 1,200-Å-thick silicon dioxide film 208 is then formed as a gate insulating film by sputtering.

Further, a 4,000-Å-thick aluminum film (containing scandium at 0.2–0.5 wt %) is formed by sputtering. An aluminum oxide film (not shown) of 100–300 Å in thickness is formed by subjecting the surface of the aluminum film to anodic oxidation. By etching the above films, gate electrodes 210a and 210b are formed.

A photoresist mask 209a and 209b that was used for the etching is left as it is. (see FIG. 2(C))

Next, porous anodic oxidation is performed with the photoresist mask 209a and 209b left attached in a manner disclosed in Japanese Patent Application No. Hei. 6-338612. In this step, porous anodic oxide layers 211a and 211b are formed on the side faces of the gate electrodes 210a and 210b. In this embodiment, the thickness of the porous anodic oxide layers 211a and 211b are set at 3,000–10,000 Å, for instance, 5,000 Å. A width of the low concentration impurity region that will be formed later is determined by the thickness of these anodic oxide layers.

Then, after the photoresist mask 49a and 49b is removed, anodic oxidation is performed to form dense anodic oxide coatings 212a and 212b of 1,200 Å in thickness. (see FIG. 2(D))

Thickness of these dense anodic oxide films 212a, 212b can be selected from the range of 100 Å to 3000 Å. These anodic oxide films 212a, 212b mainly has tow roles.

One is a role as a barrier film for not causing an extraordinary growth and dissolution of aluminum in the subsequent heating or laser light irradiating step, in case that aluminum is particularly used as the gate electrode material.

The other is a role for forming an offset gate region in the subsequent impurity ion implantation step. That is, these dense anodic oxide films 212a, 212b are used as masks.

Since the role in the latter case is not remarkable unless the thickness of the offset gate region is 1000 Å or more, it is necessary that the thickness of the dense anodic oxide films 212a and 212b is 1000 Å or more.

By changing the electrolyte of the anodic oxidation, the porous anodic oxide layers 211a and 211b and the dense anodic oxide coatings 212a and 212b can be formed separately. For example, the porous anodic oxide layers 211a and 211b may be formed by using an electrolyte of 3% oxalic acid. The dense anodic oxide coatings may be formed by using an electrolyte of 3% tartaric acid.

Then, the silicon dioxide film 208 is etched by dry etching with the porous anodic oxide layers 211a and 211b used as a mask. Further, only the porous anodic oxide layers 211a and 211b are etched using a mixed solution (aluminum mixed acid) of phosphoric acid, acetic acid and nitric acid. The aluminum mixed acid can etch the porous anodic oxide layers 51a and 51b but can hardly etch the dense anodic oxide coatings 212a and 212b. Thus, silicon dioxide gate insulating films 213a and 213b are left under the gate electrodes.

With the gate insulating films 213a and 213b used as a mask, impurities (phosphorus and boron; although only the NMOS transistor is shown in the figures, actually boron is also doped to produce a PMOS transistor) are introduced into the active regions by ion doping. As for the phosphorus doping, phosphorus ions are implanted at a relatively low acceleration voltage of 10–30 keV and at a relatively high dose of 5×10$^{14}$ to 5×10$^{15}$ atoms/cm$^2$. Due to the low acceleration voltage, ions do not reach deep portions; that is, phosphorus is mainly implanted into the regions 215a and 215b where the silicon is exposed.

Next, phosphorus ions are implanted at a relatively high acceleration voltage of 60–95 keV and at a relatively low dose of 1×10$^{12}$ to 1×10$^{14}$ atoms/cm$^2$. Due to the high acceleration voltage, ions reach deep portions; that is, phosphorus is also implanted into the regions 215a and 215b.

As a result, there are formed the regions 214a and 214b where phosphorus has been doped at a high concentration and the regions 215a and 215b where phosphorus has been doped at a low concentration. That is, what is called a double drain structure is obtained. The drain side of these phosphorus doped low concentration regions 215a, 215b is a region generally called LDD region. After the doping, impurities may be activated by laser light illumination. (see FIG. 2(E))

Subsequently, a 4,000-Å-thick silicon dioxide film 216 is deposited as a first interlayer insulating film by plasma CVD. After contact holes are formed in the silicon dioxide film 216, aluminum electrodes/wiring lines 217a–217c are formed. Further, a 2,000-Å-thick silicon nitride film 218 is deposited as a second interlayer insulating film by plasma CVD. After a contact hole is formed on the drain side of the TFT in the matrix area, an ITO pixel electrode 219 is formed. In the above-described manner, a monolithic active matrix circuit can be formed. (see FIG. 2(F))

In the figure, reference numerals 220 and 221 designate offset gate region. These regions are formed since the dense anodic oxide films 212a and 210b formed around the gate electrodes serve as masks during the impurity ion implantation. These regions function as high resistance regions and have the similar effects to the case where an LDD (lightly doped drain) is provided. That is, an off current can be reduced.

An NMOS TFT manufactured according to this embodiment can have typical electric field nobilities of 140–180 cm$^2$/Vs in the peripheral circuits and 20–30 cm$^2$/Vs in the matrix circuit. The off-current in the matrix circuit can have an average of 1.3 pA and a variation ($3\sigma$) of a little less than 10%.

Embodiment 2

A second embodiment of the invention will be described with reference to FIGS. 2(A)–2(F). First, a 2,000-Å-thick undercoat silicon dioxide film 202 is deposited on a glass substrate 201 by plasma CVD. Then, a 500-Å-thick amorphous silicon film 203 is deposited by low-pressure CVD, and a 1,000-Å-thick silicon dioxide film 204 is deposited by plasma CVD.

Then, by etching the silicon dioxide film 204, only the amorphous silicon film in the peripheral circuit area is exposed. A very thin (estimated to be 40–100 Å) silicon dioxide film is formed on the exposed surface of the amorphous silicon film by immersing the substrate in an ammonia solution of hydrogen peroxide. A very thin nickel acetate film 205 is formed by spin coating in the same manner as in the first embodiment. (FIG. 2(A))

Subsequently, thermal annealing is performed at 400° C. for 0.5 hour. In this step, nickel acetate is decomposed and slightly diffused into amorphous silicon. After the silicon oxide film 204 is removed to expose the amorphous silicon film 203, the substrate is illuminated with XeCl excimer laser light (wavelength: 308 nm). In the step of etching the silicon oxide film 204, buffer hydrofluoric acid is used. In this step, although nickel remaining on the amorphous silicon film and a surface portion of the amorphous silicon film having a large nickel concentration are etched, nickel whose amount is sufficient for crystallization diffuses into the amorphous silicon film and is left therein.

In this embodiment, the laser light energy density is set at 300–400 mJ/cm$^2$, for instance, 350 mJ/cm$^2$. As a result, crystallization is effected in both of the peripheral circuit area 206a and the matrix area 206b. In particular, superior crystallinity can be obtained in the silicon film 206a in the peripheral circuit area where the nickel acetate coating was formed.

This embodiment uses the amorphous silicon film that is formed by a low-pressure CVD and therefore has a small hydrogen content in a deposited state. Therefore, sufficient crystallinity can also be obtained in the silicon film 206b in the matrix area by illumination with laser light of a low energy density. (see FIG. 2(B))

Then, to reduce stress due to the laser light illumination, thermal annealing is performed. In this embodiment, the thermal annealing is performed at 550° C. for 4 hours.

Thereafter, island-like active regions 207a and 207b are formed by etching the silicon film. A 1,200-Å-thick silicon dioxide film 208 is then formed as a gate insulating film. Further, a 4,000-Å-thick aluminum film (containing scandium at 0.2–0.5 wt %) is formed by sputtering. By etching the aluminum film, gate electrodes 210a and 210b are formed. A photoresist mask 209a and 209b that was used for the etching is left as it is. (see FIG. 2(C))

Next, porous anodic oxide layers 211a and 211b and dense anodic oxide coatings 212a and 212b are formed. (see FIG. 2(D))

With the porous anodic oxide layer 211a and 211b used as a mask, the silicon dioxide film 208 is etched by dry etching, so that silicon dioxide gate insulating films 213a and 213b are left under the gate electrodes.

Then, with the gate insulating films 213a and 213b used as a semi-transparent mask, impurities are introduced into the active regions by ion doping. Thus, there are formed regions 214a and 214b where phosphorus has been doped at a high concentration and regions 215a and 215b where phosphorus has been doped at a low concentration. Boron is also doped in the similar manner. (see FIG. 2(E))

Subsequently, a first interlayer insulating film (silicon dioxide film) 216, aluminum electrodes/wiring lines 217a–217c, a second interlayer insulating film (silicon nitride film) 218, and an ITO pixel electrode 219 are formed. In the above-described manner, a monolithic active matrix circuit can be formed. (see FIG. 2(F))

Embodiment 3

FIGS. 3(A)–3(F) show a manufacturing process of this embodiment, which relates to a method of manufacturing a monolithic active matrix circuit including CMOS peripheral circuits. For simplification, a peripheral circuit portion is also illustrated only as an NMOS transistor in the figures. In FIGS. 3(A)–3(F), the left-hand side and the right-hand side representatively show a peripheral circuit portion and a matrix circuit portion, respectively.

First, a 2,000-Å-thick undercoat silicon dioxide film 302 is deposited on a glass substrate 301 by plasma CVD. Further, a 500-Å-thick amorphous silicon film 303 and a 1,000-Å-thick silicon dioxide film 304 are deposited by plasma CVD. The silicon dioxide film 304 is patterned by a known photolithographic method. The patterned silicon dioxide film 304 serves as a mask for selectively introducing nickel, which is a catalyst element for accelerating crystallization of silicon.

In this state, a window 305 for selectively introducing the catalyst element into a portion of the amorphous silicon film 303 in the peripheral circuit area is formed in the silicon dioxide film 304. The amorphous silicon film 303 is exposed through the window 305.

A very thin (estimated to be 40–100 Å) silicon dioxide film (not shown) is formed on the exposed surface of amorphous silicon by performing thermal annealing at 550° C. for 1 hour in an oxidizing atmosphere. A very thin nickel acetate film 306 is then formed by spin coating. In this embodiment, a nickel acetate solution of 1–100 ppm is uniformly applied to form a thin layer by using a spin coater. (see FIG. 3(A))

Next, thermal annealing is performed at 550° C. for 8 hours in a nitrogen atmosphere. In the area of the window 305, the layer of the nickel acetate solution is substantially in contact with the amorphous silicon film 303. Therefore, in this area, the thermal annealing causes nickel to diffuse into amorphous silicon. That is, in the peripheral circuit area, a crystalline silicon region 307a is formed in this thermal annealing step. As nickel diffuses, the crystallization proceeds in the horizontal direction as indicated by arrows in FIG. 3(B) (horizontal growth).

On the other hand, in the matrix area, nickel does not reach silicon because of the existence of the silicon dioxide film 304. Therefore, the film 303 remains amorphous. However, after the thermal annealing step, hydrogen has been removed from silicon through the silicon dioxide film 304.

Thus, there can be obtained the crystalline region 307a and an amorphous silicon region 307b having a hydrogen content of 0.1% or less.

Subsequently, the silicon dioxide film 304 is removed to expose the silicon film, which is then illuminated with XeF excimer laser light (wavelength: 353 nm). In this embodiment, the laser light energy density is set at 250–300 mJ/cm$^2$. As a result, the crystallinity of the crystalline silicon region 307a is improved to produce a highly crystalline silicon region 308a. The amorphous silicon region 307b is crystallized by this laser light illumination, to become a crystalline silicon region 308b. (FIG. 3(C))

Thereafter, island-like active regions 309a and 309b are formed by etching the crystalline silicon regions 308a and 308b. Then, a 1,200-Å-thick silicon dioxide film is formed as a gate insulating film by plasma CVD. Monosilane and dinitrogen monoxide are used as material gases of the plasma CVD.

Further, a 4,000-Å-thick aluminum film (containing scandium at 0.2–0.5 wt %) is formed by sputtering, and gate electrodes 310a and 310b are formed by patterning it. Then, porous anodic oxide layers 311a and 311b are formed in an anodic oxidation step. Further, dense anodic oxide coatings 313a and 313b are formed. Gate insulating films 312a and 312b are thereafter formed by etching a silicon oxide film (not shown). (see FIG. 3(D))

In this embodiment, the thickness of the porous anodic oxide 311a, 311b is 3000 Å. The thickness of the dense anodic oxide films 313a, 313b is 1500 Å. Thus is obtained the structure which has, as described below, the low concentration impurity region having a width of 3000 Å and the offset gate region having a width of 2500 Å. This structure is effective particularly when a low off current characteristic is desired.

After the porous anodic oxide layers 311a and 311b are etched, doping is performed to form source and drain regions. Since the gate insulating films 312a and 312b exist in this doping step, there are formed high-concentration impurity regions 314a and 314b and low-concentration impurity regions 315a and 315b having a width of 3000 Å. Furthermore, offset gate regions 300a and 300b having a width of 1500 Å are formed. (see FIG. 3(E))

Subsequently, a first interlayer insulating film (silicon dioxide film) 316 is deposited by sputtering. Further, aluminum electrodes/wiring lines 317a–317c, a second interlayer insulating film (silicon nitride film) 318, and an ITO pixel electrode 319 are formed. In the above-described manner, a monolithic active matrix circuit can be formed. (see FIG. 3(F))

In the structure employed in this embodiment, the thickness of the porous anodic oxide 311a, 311b is 3000 Å, and the thickness of the dense anodic oxide films 313a, 313b is 1500 Å. Thus is obtained the structure which has the low concentration impurity regions 315a, 315b having a width of 3000 Å and the offset gate region (not shown in the figure).

Yhis structure is effective particularly when a low off current characteristics is desired.

Embodiment 4

A fourth embodiment of the invention will be described with reference to FIGS. 3(A)–3(F), in which the left-hand side and the right-hand side representatively show a peripheral circuit portion and a matrix circuit portion, respectively.

A 2,000-Å-thick undercoat silicon dioxide film 302, a 500-Å-thick amorphous silicon film 303, and a 1,000-Å-thick silicon dioxide film 304 are sequentially deposited on a glass substrate 301 by plasma CVD. The silicon dioxide film 304 is patterned by a known photolithographic method, to form a window 305 for adding a catalyst element.

A very thin silicon dioxide film is formed on the surface of amorphous silicon exposed through the window 305 by using a mixed liquid of hydrogen peroxide and ammonia. A very thin nickel acetate film 306 is then formed by spin coating. (see FIG. 3(A))

Then, thermal annealing is performed at 550° C. for 8 hours in a nitrogen atmosphere, to form a horizontal growth region 307a. (see FIG. 3(B))

Subsequently, the silicon dioxide film 304 is removed to expose the silicon film, which is illuminated with XeF excimer laser light (wavelength: 353 nm). As a result, crystalline silicon regions 308a and 308b are obtained. In this state, the crystallinity of the region 308a is higher than the region 308b. (see FIG. 3(C))

Then, island-like active regions 309a and 309b are formed by etching the silicon film. A 1,200-Å-thick silicon dioxide film is formed as a gate insulating film.

After a 4,000-Å-thick aluminum film (containing scandium at 0.2–0.5 wt %) is formed by sputtering, gate electrodes 310a and 310b, dense anodic oxide coatings 313a and 313b, porous anodic oxide layers 311a and 311b, and gate insulating films 312a and 312b are formed by the same steps as in the other embodiments. (FIG. 3(D))

Next, the porous anodic oxides 311a, 311b are etched, and the high concentration impurity regions 314a, 314b and low concentration impurity regions 315a, 315b are formed by doping. Simultaneously, offset gate regions 300a, 300b are formed.

After the porous anodic oxide layers 311a and 311b are etched, doping is performed to form high-concentration impurity regions 314a and 314b and low-concentration impurity regions 315a and 315b. Simultaneously, offset gate regions 300a and 300b are formed. (see FIG. 3(E))

Subsequently, a first interlayer insulating film (silicon dioxide film) 316, aluminum electrodes/wiring lines 317a–317c, a second interlayer insulating film (silicon nitride film) 7318, and an ITO pixel electrode 319 are formed. In the above-described manner, a monolithic active matrix circuit can be formed. (see FIG. 3(F))

Embodiment 5

The present example is illustrated in FIGS. 4(A)–4(F). The present example relates to a method of fabricating a monolithic active matrix circuit. In the present example, a peripheral logic circuit assumes the form of CMOS circuits. For simplicity, of the peripheral logic circuit, only the NMOS circuit is shown. In FIGS. 4(A)–4(F), the left side typically shows the peripheral logic circuit, while the right side shows a matrix circuit. The present invention is characterized in that TFTs in the peripheral logic circuit region operate at high speeds and that TFTs in the matrix circuit region have low OFF current characteristics.

First, a silicon oxide film 402 is formed as a buffer layer on a glass substrate 401 to a thickness of 2000 Å by plasma-assisted CVD. Then, an amorphous silicon film 403 having a thickness of 500 Å is formed on the silicon oxide film 402. Subsequently, a silicon oxide film 404 having a thickness of 1000 Å is formed on the amorphous silicon film 403.

The silicon oxide film 404 is etched to expose only the amorphous silicon film 403 in the peripheral logic circuit region. The laminate is irradiated with UV radiation emitted by a mercury lamp in an ozone ambient. In this way, a quite thin silicon oxide film is formed on the exposed surface of the amorphous silicon film 403. Then, a quite thin film 405 of nickel acetate is formed by spin coating (FIG. 4(A)).

Thereafter, the laminate is thermally annealed at 550° C. for 4 hours to crystallize the amorphous silicon film 403 in the peripheral logic circuit region, thus resulting in a crystalline silicon region. Under these heat-treatment conditions, the amorphous silicon film 403 in the matrix region is not crystallized but remains amorphous. However, the hydrogen contained in the amorphous silicon film 403 is sufficiently released by this thermal annealing.

Then, the silicon oxide film 404 is removed so as to expose the amorphous silicon film 403. The laminate is irradiated with KrF excimer laser light having a wavelength of 248 nm. In the present example, in order to enhance the uniformity of the crystallinity, the irradiation step is performed twice.

As a result, the crystallinity of the crystalline silicon film in the peripheral logic circuit region is improved further. Thus, crystalline silicon 406a is obtained. Also, the amorphous silicon region is crystallized to thereby form crystalline silicon 406b. Of course, the laser irradiation may be carried out under one condition (FIG. 4(B)).

Figure 4A:
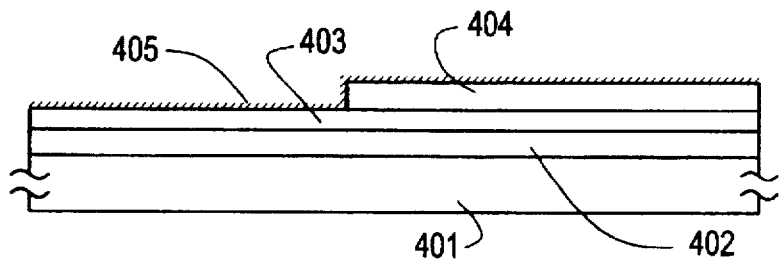
FIGS. 4(A)–4(F) are sectional views showing a manufacturing process according to embodiment 5 of the invention.
Figure 4B:
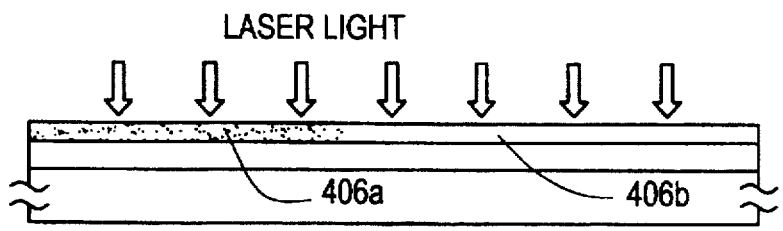
Figure 4C:
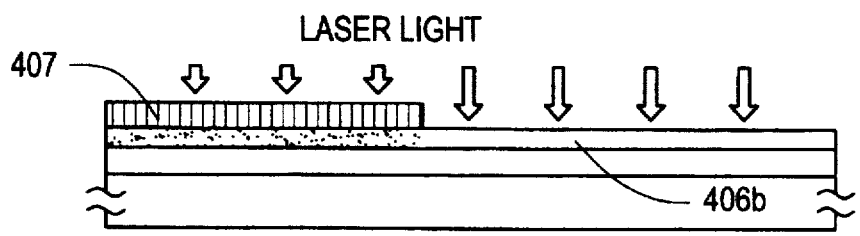
Figure 4D:
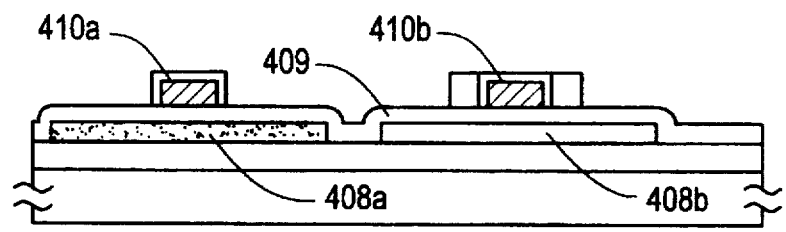
Figure 4E:
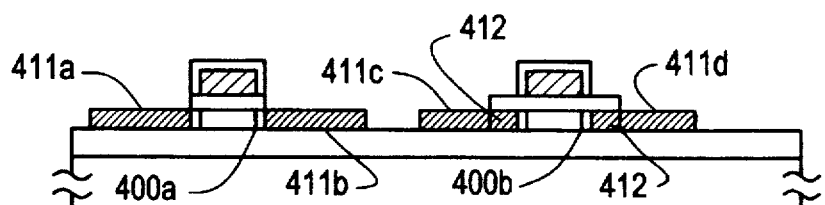
Figure 4F:
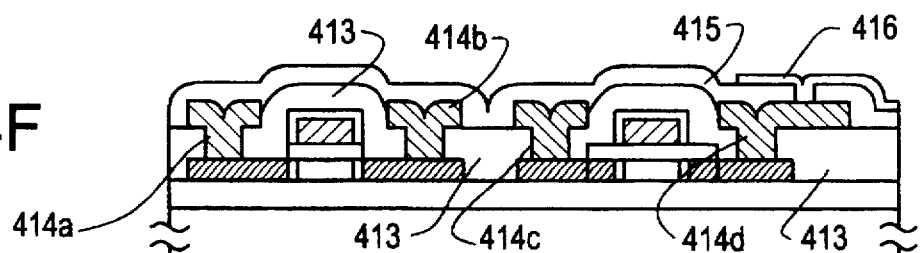
Figure 5A:
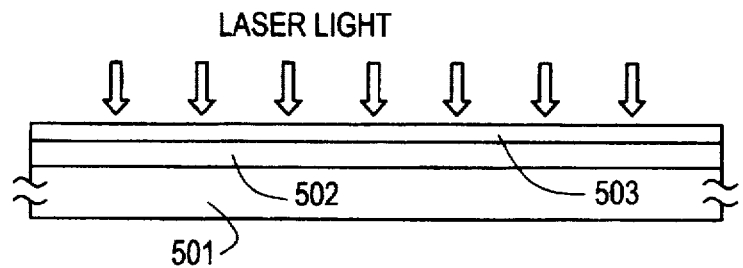
FIGS. 5(A)–5(F) are sectional views showing a manufacturing process according to embodiment 6 of the invention.
Figure 5B:
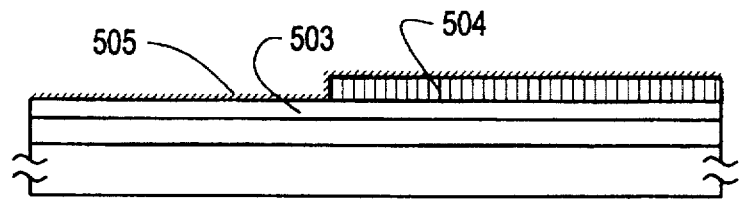
Figure 5C:
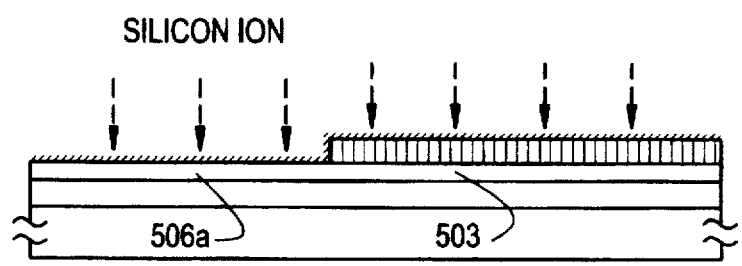
Figure 5D:
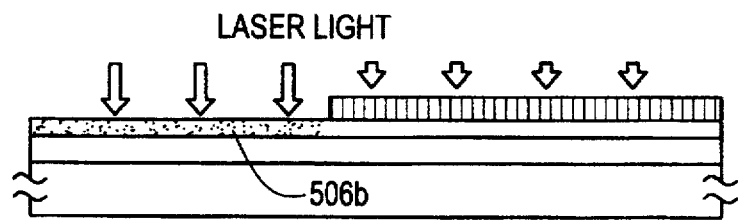
Figure 5E:
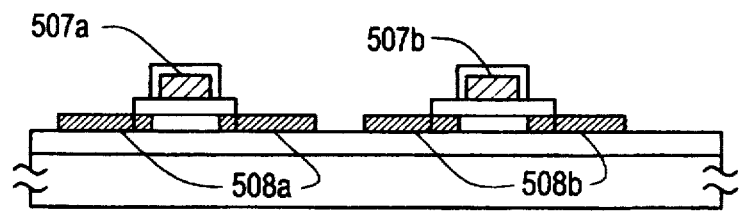
Figure 5F:
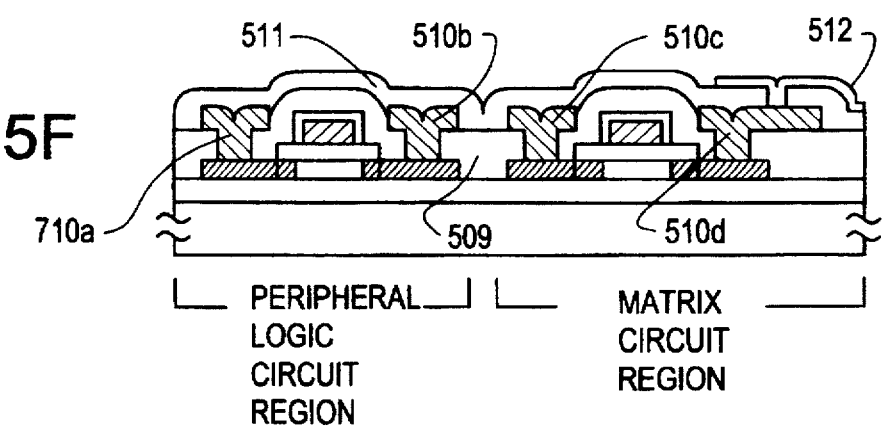
Figure 6A:
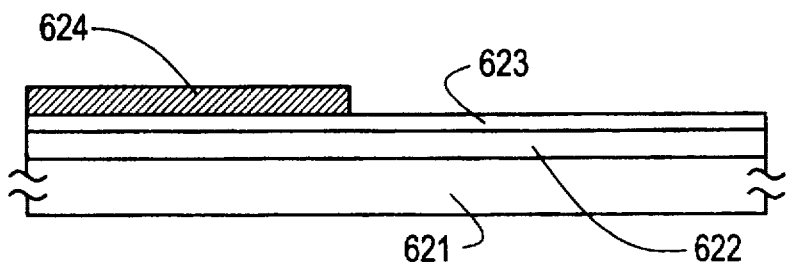
FIGS. 6(A)–6(E) are sectional views showing a manufacturing process according to embodiment 7 of the invention.
Figure 6B:
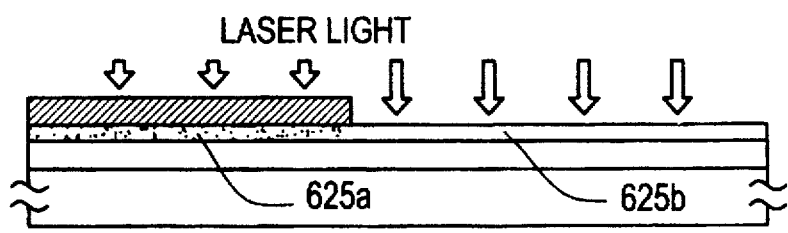
Figure 6C:
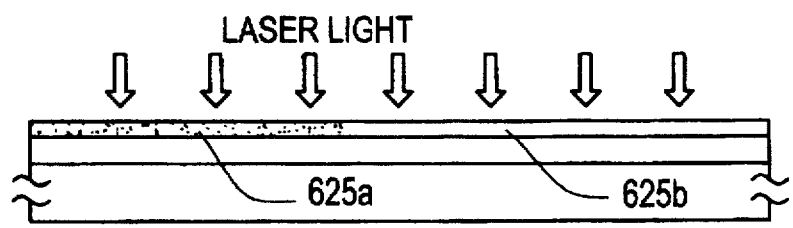
Figure 6D:
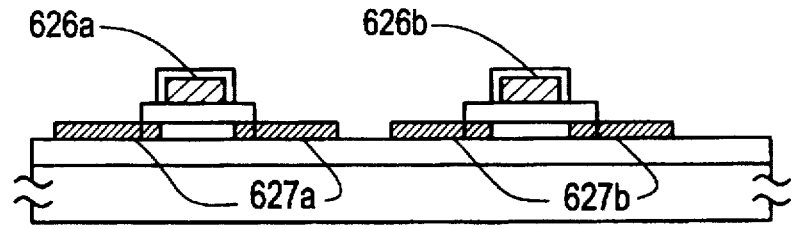
Figure 6E:
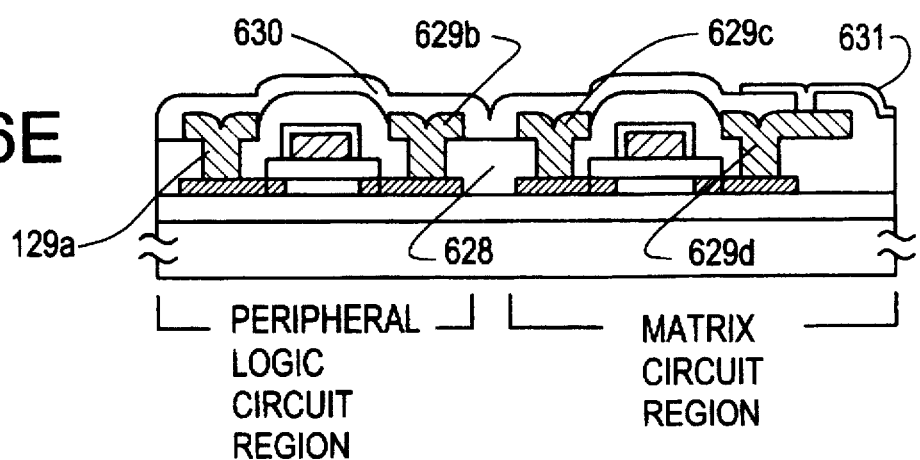

However, the crystalline silicon 406b in the matrix circuit region has semiconductor characteristics which are not satisfactory for the present example. The crystallinity is required to be improved further by irradiating the substrate with laser light of higher energy density. However, if this laser light is made to hit the crystalline silicon 406a of the peripheral logic circuit, the crystallinity is deteriorated. Accordingly, in the present example, as shown in FIG. 4(C), a mask 407 is placed in the peripheral logic circuit region to prevent the laser light from directly hitting the crystalline silicon 406a. Then, the laser irradiation is continued.

In the present example, the mask 407 is made from silicon nitride which absorbs ultraviolet radiation. The energy density of the irradiating laser light is 350 to 400 mJ/cm$^2$, e.g., 380 mJ/cm$^2$. The laser light is KrF excimer laser light having a wavelength of 248 nm. At the portion coated with the mask 407, the energy density of the impinging laser light is attenuated to less than 350 mJ/cm$^2$. Therefore, the crystalline silicon 406a is not substantially affected. In this way, crystalline silicon 406c of higher crystallinity can be obtained. After the laser irradiation, thermal annealing may be conducted in order to alleviate the stress (FIG. 4(C)).

Then, the silicon film is etched into active regions in the form of islands 408a and 408b. A silicon oxide film 409 having a thickness of 1200 Å is formed as a gate-insulating film by sputtering.

Also, an aluminum film containing 0.2–0.5% by weight of scandium and having a thickness of 4000 Å is formed by sputtering. A porous anodic oxide having a thickness of 4000 Å is formed on the side surfaces of the gate electrode 410b of the matrix circuit.

A dense anodic oxide coating is formed to a thickness of 2000 Å on the top and side surfaces of the gate electrode 410b. Also, a dense anodic oxide coating is formed to a thickness of 2000 Å on the top and side surfaces of the gate electrode 410a. During the formation of the porous anodic oxide, no current is supplied to the gate electrodes/ interconnects 410a for the peripheral logic circuit (FIG. 4(D)).

Using the anodic oxide as a mask, the silicon oxide film 409 is etched by dry etching. Only the porous anodic oxide is etched with aluminum mixed acid. Using the remaining gate-insulating film 409, impurity ions (phosphorus ions and boron ions) are implanted into the active regions by ion doping techniques. Although only the NMOS circuit is shown, boron ions are also implanted in practice.

As a result, regions 411a and 411b heavily doped with phosphorus and a region 412 lightly doped with phosphorus are formed. The lightly doped region 412 has a width of 4000 Å. At the same time, offset gate regions 400a and 400b are formed. In the present example, only the TFTs of the matrix circuit assume a double drain structure (FIG. 4(E)).

Then, a first interlayer insulator 413 having a thickness of 4000 Å and consisting of silicon oxide is deposited. Contact holes are formed in this insulator film. Titanium electrodes/ interconnects 414a, 414b, 414c, and 414d are formed. A second interlayer insulator 415 having a thickness of 2000 Å and consisting of silicon nitride is deposited. Contact holes are formed in the drain electrode 414d of the TFT in the matrix region. A pixel electrode 416 is formed from ITO. In this way, a monolithic active matrix circuit is completed (FIG. 4(F)).

In the configuration of the present example, no lightly doped regions are disposed in the TFTs arranged in the peripheral circuit region. The lightly doped regions are disposed in the matrix region.

In this structure, the TFTs arranged in the peripheral circuit region can be operated at high speeds because the mobilities can be prevented from decreasing by absence of the lightly doped regions. The TFTs in the matrix region can be operated at high speeds because the presence of the lightly doped regions can lower the OFF current.

Embodiment 6

The present example is illustrated in FIGS. 5(A)–5(F). The present example relates to a method of fabricating a monolithic active matrix circuit. In the present example, a peripheral logic circuit assumes the form of CMOS circuits. For simplicity, only the NMOS circuit of the peripheral logic circuit is shown. In FIGS. 5(A)–5(F), the left side typically shows the peripheral logic circuit, while the right side shows a matrix circuit.

First, a silicon oxide film 502 is formed as a buffer layer on a glass substrate 501 to a thickness of 2000 Å by plasma-assisted CVD. Then, an amorphous silicon film 503 having a thickness of 500 Å is formed on the silicon oxide film 502. Subsequently, the laminate is dehydrogenated at 450° C. for 1 hour. Thereafter, the silicon film 503 is irradiated with KrF excimer laser light having a wavelength of 248 nm. In the present example, in order to enhance the uniformity of the crystallinity, the irradiation step is performed twice. In the first irradiation, the energy density of the laser light is 200 to 250 mJ/cm$^2$, e.g., 220 mJ/cm$^2$. In the second irradiation, the energy density of the laser light is 350 to 400 mJ/cm$^2$, e.g., 380 mJ/cm$^2$. In this way, the whole silicon film 503 is crystallized (FIG. 5(A)).

Then, a silicon nitride film 504 having a thickness of 3000 Å is formed and etched to expose only the silicon film 503 in the peripheral logic circuit region. The laminate is irradiated with ultraviolet radiation emitted by a mercury lamp in an ozone ambient to form a quite thin film of silicon oxide on the surface of the exposed silicon film 503. Then, a quite thin film 505 of nickel acetate is formed by spin coating (FIG. 5(B)).

Under this condition, silicon ions are implanted by ion implantation techniques at an accelerating voltage of 10 to 30 kV and at a dose of $1\times10^{15}$ to $1\times10^{16}$ atoms/cm$^2$. As a result, in the peripheral logic circuit region not coated with the silicon nitride film 504, an amorphous silicon film 506a is formed by ion bombardment damage. On the other hand, in the matrix circuit region coated with the silicon nitride film 504, the crystalline state created by the previous laser irradiation is maintained (FIG. 5(C)). The order of the step of FIG. 5(B) and the order of the step of FIG. 5(C) may be interchanged.

Then, the laminate is thermally annealed at 550° C. for 4 hours in a nitrogen ambient to crystallize the peripheral logic circuit region, thus obtaining a crystalline silicon film 506b. The crystalline silicon film 506b is irradiated with laser light to improve the crystallinity further. In the present example, the laser irradiation is repeated twice to enhance the uniformity of the crystallinity (FIG. 5(D)).

Thereafter, the silicon nitride film 504 is removed. By the manufacturing steps described thus far, the matrix region and the peripheral logic circuit region have silicon films to which their respective requisite degrees of crystallinity have been imparted. After the laser irradiation, in order to alleviate the stress, thermal annealing may also be carried out.

Then, the crystalline silicon film is etched into an active region in the form of islands. A porous anodic oxide coating and a dense anodic oxide coating are formed. In the present example, the thickness of the dense anodic oxide coating is 500 Å. An N-channel TFT of a double drain structure consisting of a lightly doped N-type region and a heavily doped N-type region is obtained by the method illustrated in FIGS. 3(A)–3(F) or FIGS. 4(A)–4(F). This N-channel TFT has gate electrodes 507a and 507b coated with the dense anodic oxide coating. Heavily doped N-type regions 508a and 508b form source/drain regions. Since the dense anodic oxide coating is as thin as 500 Å, the offset gate region is small. Therefore, the offset gate region is not shown (FIG. 5(E)).

In the present example, the lightly doped N-type regions in the peripheral logic circuit region is narrower than the lightly doped N-type regions in the matrix circuit region. The lightly doped N-type regions formed between the source or drain region and the channel formation region is mainly effective in lowering the field intensity near the interface between the channel formation region and the drain region and in improving the OFF current characteristics.

On the other hand, the lightly doped regions are high-resistivity regions and lower the mobilities. That is, the lightly doped regions lower the operating speed of the TFTs.

Therefore, in the peripheral logic circuit region which is required to have high mobilities but not required to have very low OFF current characteristics, the lightly doped N-type regions have a small width. Meanwhile, in the matrix circuit which is not required to have high mobilities but required to have the lowest OFF current characteristics, the lightly doped regions have a large width. In this way, TFTs having characteristics matched to their respective circuit regions can be selectively formed.

Then, a first interlayer insulator 509 having a thickness of 4000 Å and consisting of silicon oxide is deposited. Contact holes are formed in this insulator film. Titanium electrodes/interconnects 510a, 510b, 510c, and 510d are formed. A second interlayer insulator 511 having a thickness of 2000 Å and consisting of silicon nitride is deposited. Contact holes are formed in the drain electrode 510d of the TFT in the matrix region. A pixel electrode 512 is formed from ITO. In this way, a monolithic active matrix circuit is completed (FIG. 5(F)).

Embodiment 7

The present example is illustrated in FIGS. 6(A)–6(E). The present example relates to a method of fabricating a monolithic active matrix circuit. In the present example, a peripheral logic circuit assumes the form of CMOS circuits. For simplicity, of the peripheral logic circuit, only the NMOS circuit is shown. In FIGS. 6(A)–6(E), the left side typically shows the peripheral logic circuit, while the right side shows a matrix circuit.

First, a silicon oxide film 622 is formed as a buffer layer on a glass substrate 621 to a thickness of 2000 Å by plasma-assisted CVD. Subsequently, an amorphous silicon film 623 having a thickness of 500 Å is formed on the silicon oxide film 622.

Then, a silicon compound and an additive are dissolved in an organic solvent which contains a given concentration of nickel. This solvent is used for formation of a silicon oxide film. One example of this solvent is OCD (Ohka diffusion source) produced by Tokyo Ohka Kogyo Co., Ltd. This solvent is applied to the silicon film 623, and then the laminate is baked, thus forming a silicon oxide film 624.

More specifically, OCD Type-2 Si 59000 is used as a base. Nickel (II) acetylacetonate is dissolved in methyl acetate and mixed into the OCD solution. The used solution is so adjusted that it contains 2.0% by weight of SiO$_2$ and 200–2000 ppm of nickel.

An appropriate amount of the solution is dripped onto the surface of the amorphous silicon film 623. A spin-coating operation is carried out at 2000 rpm for 15 seconds, using a spinner. Then, a prebake operation is performed at 250° C. for 30 minutes. In this way, a silicon oxide film 124 containing nickel is formed. The prebake temperature is determined, taking account of the decomposition temperature of the nickel compound (FIG. 6(A)).

The aforementioned liquid which is applied to the silicon film 623 to form the silicon oxide film may be prepared by dispersing fine powder of silicon oxide in an organic solvent. Where the above-described OCD is used as the solution to be dripped onto the amorphous silicon film 623 and nickel is used as a catalyst, any one of the following methods can be adopted:

(1) A nickel compound is directly added to the OCD.

(2) A nickel compound is dissolved in a solvent, thus preparing a solution. This solution is added to the OCD.

Where the method (1) above is adopted, it is necessary that the nickel compound be dissolvable in the solvent of OCD. Examples of the nickel compound include nickel acetylacetonate and 2-ethylhexoic nickel.

Where the method (2) above is utilized, water, alcohol, ester, ketone, or the like can be used as the solution of nickel compound. Preferably, the nickel compound solution is the same as the solvent of OCD.

In this case, nickel is introduced in the form of a nickel compound. Typically, this nickel compound can be selected from the group consisting of nickel bromide, nickel acetate, nickel oxalate, nickel chloride, nickel iodide, nickel nitrate, nickel sulfate, nickel formate, nickel acetylacetonate, and 4-cyclohexyl butyric nickel, and is dissolved in an alcohol and used.

Addition of a surface active agent to the solution containing a catalytic element is useful. The adhesion to the desired surface can be enhanced by using an adhesion promoter such as HMDS (hexamethyldisilazane) typified by OAP manufactured by Tokyo Ohka Kogyo Co., Ltd. on the desired surface.

In the example described thus far, the solution in which nickel, or a catalytic element, has been fully dissolved is used. It is not always necessary that nickel be fully dissolved. For instance, powder consisting of nickel alone or a nickel compound is uniformly dispersed in a dispersing medium, thus preparing an emulsion. This emulsion is mixed into OCD.

In the present example, sample I and sample II were prepared. Each sample consisted of the silicon oxide film 624. Samples I and II had thicknesses of 400 Å and 3000 Å, respectively.

Then, the silicon oxide film 624 was etched to expose the silicon film 623 in the matrix circuit region. The laminate was thermally annealed at 550° C. for 4 hours in a nitrogen ambient. As a result, nickel contained in the silicon oxide film 624 was diffused into the amorphous silicon film 623. This crystallized the amorphous silicon film 624 in the peripheral logic circuit region, thus obtaining a crystalline silicon film 625a. The amorphous silicon film 623 in the matrix circuit region not coated with the silicon oxide film 624 contained no nickel and so the amorphous silicon film 623 was not crystallized in spite of the dehydrogenation.

Thereafter, the silicon film 623 was irradiated with KrF excimer laser light having a wavelength of 248 nm while the silicon oxide film 624 remained on the silicon film 623. In the present example, in order to enhance the uniformity of the crystallinity, the irradiation step was performed twice. In the first irradiation, the energy density of the laser light was 200 to 250 mJ/cm$^2$, e.g., 220 mJ/cm$^2$. In the second irradiation, the energy density of the laser light was 350 to 400 mJ/cm$^2$, e.g., 380 mJ/cm$^2$. In this way, the amorphous silicon film 623 in the matrix circuit region was crystallized, thus obtaining a crystalline silicon film 625b (FIG. 6(B)).

With respect to sample I, the thickness of the silicon oxide film 624 was 400 Å and so a considerable amount of energy of the laser light reached the silicon film of the peripheral logic circuit. In the first irradiation, the energy was about 200 mJ/cm$^2$. In the second irradiation, the energy was about 340 mJ/cm$^2$. This could enhance the crystallinity of the crystalline silicon film 625a. On the other hand, with respect to sample II, the thickness of the silicon oxide film 624 was as large as 3000 Å and, therefore, a considerable amount of the laser light was absorbed. The laser irradiation was not useful in improving the crystallinity of the crystalline silicon film 625a. Accordingly, the silicon oxide film 624 of sample II was removed, and sample II was irradiated with laser light. In the present example, the energy density of the laser light was 300 to 350 mJ/cm$^2$, e.g., 340 mJ/cm$^2$. These energy densities hardly affected the crystalline silicon film in the matrix circuit region. In this way, a crystalline silicon film 625c was obtained (FIG. 6(C)).

By the manufacturing steps described thus far, the matrix circuit region having the silicon film 625b of the required crystallinity and the peripheral logic circuit region having the thin film 625c of the required crystallinity were derived. After the laser irradiation, in order to alleviate stress, thermal annealing could be carried out.

Then, the crystalline silicon films 625b and 625c were etched into active regions in the form of islands. A TFT consisting of gate electrodes 626a, 626b, a lightly doped N-type region, and a heavily doped N-type region was fabricated by the same method as used in the other examples. The top and side surfaces of the gate electrodes 626a and 626b were covered with an anodic oxide coating. In the figure, heavily doped regions 627a and 627b formed source/drain regions (FIG. 6(D)). In the present example, the thickness of the dense anodic oxide layer was 300 Å. Since the dense anodic oxide coating was as thin as 300 Å, the offset gate region was small. Therefore, the offset gate region is not shown.

Thereafter, a first interlayer insulator 628 having a thickness of 4000 Å and consisting of silicon oxide was deposited. Contact holes were formed in this insulator film. Titanium electrodes/interconnects 629a, 629b, 629c, and 629d were formed. A second interlayer insulator 630 having a thickness of 2000 Å and consisting of silicon nitride was deposited. Contact holes were formed in the drain electrode 629d of the TFT in the matrix region. A pixel electrode 631 was formed from ITO. In this way, a monolithic active matrix circuit was completed (FIG. 6(E)).

As described in the above examples, TFTs capable of high-speed operation and TFTs having low leakage current can be formed on the same substrate according to the present invention. Where these TFTs are applied to liquid crystal displays, the productivity and characteristics are improved.

What is claimed is:

1. A monolithic active matrix circuit comprising:
a thin-film transistor provided in a peripheral circuit and having an active region containing a catalyst element that has been introduced thereinto intentionally; and
a thin-film transistor provided in a matrix area and containing a catalyst element in an active region of the thin-film transistor provided in the matrix area at a concentration lower than in the active region of the thin-film transistor provided in the peripheral circuit, the thin-film transistor provided in the matrix area comprising:
a pair of high-concentration impurity regions constituting source and drain regions; and
a pair of low-concentration impurity regions provided between a channel forming region and the source region and between the channel forming region and the drain region.

2. The circuit of claim 1 wherein the concentration of the catalyst element in the active region of the thin-film transistor provided in the peripheral circuit is 1×10$^{15}$ to 1×10$^{19}$ atoms/cm$^3$.

3. The circuit of claim 1 wherein the concentration of the catalyst element in the active region of the thin-film transistor provided in the matrix area is less than 1×10$^{15}$ atoms/cm$^3$.

4. The circuit of claim 1 wherein the catalyst element is one or a plurality of elements selected from the group consisting of Fe, Co, Ni, Rh, Pd, Os, Ir, Pt, Cu and Au.

5. The circuit of claim 1 wherein the concentration of the catalyst element is defined by a minimum value measured by secondary ion mass spectroscopy.

6. The circuit of claim 1 wherein the thin-film transistor provided in the matrix area further comprises a pair of offset gate regions.

7. The circuit of claim 1 wherein the thin-film transistor provided in the peripheral circuit and the thin-film transistor provided in the matrix area are provided on one substrate.

8. A monolithic active matrix circuit comprising:
a thin-film transistor provided in a matrix area;
a thin-film transistor provided in a peripheral circuit and containing a catalytic element in an active region of the thin-film transistor provided in the peripheral circuit at an amount per unit area more than 10 times as much as in an active region of the thin-film transistor provided in the matrix area, the thin-film transistor provided in the matrix area comprising:
a pair of high-concentration impurity regions constituting source and drain regions; and
a pair of low-concentration impurity regions provided between a channel forming region and the source region and between the channel forming region and the drain region.

9. The circuit of claim 8 wherein the catalyst element is one or a plurality of elements selected from the group consisting of Fe, Co, Ni, Rh, Pd, Os, Ir, Pt, Cu and Au.

10. The circuit of claim 8 wherein the concentration of the catalyst element is defined by a minimum value measured by secondary ion mass spectroscopy.

11. The circuit of claim 8 wherein the thin-film transistor provided in the matrix area further comprises a pair of offset gate regions.

12. The circuit of claim 8 wherein the thin-film transistor provided in the peripheral circuit and the thin-film transistor provided in the matrix area are provided on one substrate.

13. A monolithic active matrix circuit comprising:
a thin-film transistor provided in a peripheral circuit and having an active region containing a catalyst element; and
a thin-film transistor provided in a pixel matrix area and containing a catalyst element in an active region of the thin-film transistor provided in the pixel matrix area at a concentration lower than in the active region of the thin-film transistor provided in the peripheral circuit, the thin-film transistor provided in the pixel matrix area comprising:
at least first and second electric field alleviating regions provided between a channel forming region and a drain region of the thin-film transistor provided in the pixel matrix area,
wherein the first electric field alleviating region is in contact with the drain region and the second electric field alleviating region is provided between the first electric field alleviating region and the channel forming region, and
wherein the thin-film transistor provided in the peripheral circuit and the thin-film transistor provided in the pixel matrix area are provided on the same substrate.

14. The circuit of claim 13 wherein the thin-film transistor provided in the peripheral circuit has an electric field mobility of 140 to 180 $cm^2/Vs$.

15. The circuit of claim 13, wherein the first electric field alleviating region and the drain region contain the same impurity, and concentration of the impurity is lower in the first electric field alleviating region than in the drain region.

16. The circuit of claim 15 wherein concentration of the impurity is lower in the second electric field alleviating region than in the first electric field alleviating region.

17. A monolithic active matrix circuit comprising:
a thin-film transistor provided in a peripheral circuit and having an active region containing a catalyst element; and
a thin-film transistor provided in a pixel matrix area and containing a catalyst element in an active region of the thin-film transistor provided in the pixel matrix area at a concentration lower than in the active region of the thin-film transistor provided in the peripheral circuit, the thin-film transistor provided in the pixel matrix area comprising:
at least first and second electric field alleviating regions provided between a channel forming region and a drain region of the thin-film transistor provided in the pixel matrix area,
wherein the first electric field alleviating region is in contact with the drain region and the second electric field alleviating region is provided between the first electric field alleviating region and the channel forming region,
wherein impurity concentration is higher in the first electric field alleviating region than in the second electric field alleviating region, and
wherein the thin-film transistor provided in the peripheral circuit and the thin-film transistor provided in the pixel matrix area are provided on the same substrate.

18. The circuit of claim 17 wherein the thin-film transistor provided in the peripheral circuit has an electric field mobility of 140 to 180 $cm^2/Vs$.

19. The circuit of claim 17 wherein the first electric field alleviating region and the drain region contain the same impurity, and concentration of the impurity is lower in the first electric field alleviating region than in the drain region.

20. The circuit of claim 19 wherein concentration of the impurity is lower in the second electric field alleviating region than in the first electric field alleviating region.

21. A monolithic active matrix circuit comprising:
a thin-film transistor provided in a peripheral circuit and having an active region containing a catalyst element; and
a thin-film transistor provided in a pixel matrix area and containing a catalyst element in an active region of the thin-film transistor provided in the pixel matrix area, the thin-film transistor provided in the pixel matrix area comprising:
at least first and second electric field alleviating regions provided between a channel forming region and a drain region of the thin-film transistor provided in the pixel matrix area,
wherein the first electric field alleviating region is in contact with the drain region and the second electric field alleviating region is provided between the first electric field alleviating region and the channel forming region,
wherein the thin-film transistor provided in the peripheral circuit has an electric field mobility larger than the thin-film transistor provided in the pixel matrix area, and
wherein the thin-film transistor provided in the peripheral circuit and the thin-film transistor provided in the pixel matrix area are provided on the same substrate.

22. The circuit of claim 21 wherein the thin-film transistor provided in the peripheral circuit has an electric field mobility of 140 to 180 $cm^2/Vs$.

23. The circuit of claim 21 wherein the first electric field alleviating region and the drain region contain the same impurity, and concentration of the impurity is lower in the first electric field alleviating region than in the drain region.

24. The circuit of claim 23 wherein concentration of the impurity is lower in the second electric field alleviating region than in the first electric field alleviating region.

25. A monolithic active matrix circuit comprising:
a thin-film transistor provided in a peripheral circuit and having an active region containing a catalyst element; and
a thin-film transistor provided in a pixel matrix area and containing a catalyst element in an active region of the thin-film transistor provided in the pixel matrix area, the thin-film transistor provided in the pixel matrix area comprising:

a high-concentration impurity region constituting a drain region; and a low-concentration impurity region provided between a channel forming region and the drain region, wherein concentration of the catalyst element in the active region of the thin-film transistor provided in the pixel matrix area is less than $1 \times 10^{15}$ atoms/cm$^3$, and wherein the thin-film transistor provided in the peripheral circuit and the thin-film transistor provided in the pixel matrix area are provided on the same substrate.

26. A monolithic active matrix circuit comprising:

a thin-film transistor provided in a peripheral circuit and having an active region containing a catalyst element; and a thin-film transistor provided in a pixel matrix area and containing a catalyst element in an active region of the thin-film transistor provided in the pixel matrix area at a concentration lower than in the active region of the thin-film transistor provided in the peripheral circuit, the thin-film transistor provided in the pixel matrix area comprising:

a plurality of electric field alleviating regions provided between a channel forming region and a drain region of the thin-film transistor provided in the pixel matrix area, wherein one of the electric field alleviating regions is in contact with the drain region and another of the electric field alleviating regions is provided between the one of the electric field alleviating region and the channel forming region, and wherein the thin-film transistor provided in the peripheral circuit and the thin-film transistor provided in the pixel matrix area are provided on the same substrate.

27. A circuit according to claim 1, wherein the active region of the thin-film transistor in the peripheral circuit comprises a crystalline semiconductor film, and wherein the active region of the thin-film transistor in the matrix area comprises a crystalline semiconductor film.

28. A circuit according to claim 8, wherein the active region of the thin-film transistor in the peripheral circuit comprises a crystalline semiconductor film, and wherein the active region of the thin-film transistor in the matrix area comprises a crystalline semiconductor film.

29. A circuit according to claim 13, wherein the active region of the thin-film transistor in the peripheral circuit comprises a crystalline semiconductor film, and wherein the active region of the thin-film transistor in the matrix area comprises a crystalline semiconductor film.

30. A circuit according to claim 17, wherein the active region of the thin-film transistor in the peripheral circuit comprises a crystalline semiconductor film, and wherein the active region of the thin-film transistor in the pixel matrix area comprises a crystalline semiconductor film.

31. A circuit according to claim 21, wherein the active region of the thin-film transistor in the peripheral circuit comprises a crystalline semiconductor film, and wherein the active region of the thin-film transistor in the pixel matrix area comprises a crystalline semiconductor film.

32. A circuit according to claim 25, wherein the active region of the thin-film transistor in the peripheral circuit comprises a crystalline semiconductor film, and wherein the active region of the thin-film transistor in the pixel matrix area comprises a crystalline semiconductor film.

33. A circuit according to claim 26, wherein the active region of the thin-film transistor in the peripheral circuit comprises a crystalline semiconductor film, and wherein the active region of the thin-film transistor in the pixel matrix area comprises a crystalline semiconductor film.

* * * * *